United States Patent [19]

Hingarh et al.

[11] 4,115,797
[45] Sep. 19, 1978

[54] INTEGRATED INJECTION LOGIC WITH HEAVILY DOPED INJECTOR BASE SELF-ALIGNED WITH INJECTOR EMITTER AND COLLECTOR

[75] Inventors: Hemraj K. Hingarh, Santa Clara; Richard E. Crippen, Mountain View, both of Calif.

[73] Assignee: Fairchild Camera and Instrument Corporation, Mountain View, Calif.

[21] Appl. No.: 729,045

[22] Filed: Oct. 4, 1976

[51] Int. Cl.[2] .................... H01L 21/22; H01L 27/04; H01L 21/82
[52] U.S. Cl. ...................... 357/46; 148/187; 357/35; 357/36; 357/44; 357/89; 357/90; 357/92
[58] Field of Search ............ 357/44, 46, 20, 35, 357/89, 90, 42, 50, 92; 148/187

[56] References Cited

U.S. PATENT DOCUMENTS

| | | | |
|---|---|---|---|
| 3,411,051 | 11/1968 | Kilby | 357/35 |
| 3,608,189 | 9/1971 | Gray | 357/20 |
| 3,611,062 | 10/1971 | Rideout | 357/20 |
| 3,766,446 | 10/1973 | Tarui et al. | 357/35 |
| 3,821,776 | 6/1974 | Hayashi et al. | 357/42 |
| 3,880,675 | 4/1975 | Tarui et al. | 357/35 |
| 3,919,005 | 11/1975 | Schinella et al. | 357/44 |
| 3,919,006 | 11/1975 | Tarui et al. | 357/35 |
| 3,962,717 | 6/1976 | O'Brien | 357/35 |
| 3,982,266 | 9/1976 | Matzen et al. | 357/46 |
| 3,999,213 | 12/1976 | Brandt et al. | 357/50 |

OTHER PUBLICATIONS

Baitinger et al., IBM Tech. Discl. Bulletin, vol. 14, No. 7, Dec. 1971, p. 2239.

*Primary Examiner*—William D. Larkins
*Attorney, Agent, or Firm*—Alan H. MacPherson; Robert C. Colwell; Paul J. Winters

[57] ABSTRACT

An integrated injection logic semiconductor structure having a double diffused lateral PNP transistor and an inverted vertical NPN transistor includes an extended region of epitaxial silicon doped N type by introduction of suitable impurity from two separate regions of the semiconductor surface. This extended N type region, which functions as the base of the PNP transistor, allows an adjoining P type region, which in prior art structures served only as the collector, to be utilized as both the collector and the collector contact, thereby reducing the size of the semiconductor structure. Said N type region substantially lessens the series resistance between the base of the NPN transistor and the collector of the PNP transistor, to thereby facilitate manufacture of integrated injection logic circuits operating faster, at higher current levels, and at higher gain than integrated injection logic circuits not utilizing this invention. The extended N type region also facilitates the manufacture of faster multiple collector integrated circuit structures. Additionally, this invention will be useful in fabricating a more compact double diffused lateral transistor structure.

12 Claims, 9 Drawing Figures

INTEGRATED INJECTION LOGIC WITH HEAVILY DOPED INJECTOR BASE SELF-ALIGNED WITH INJECTOR EMITTER AND COLLECTOR

BACKGROUND OF THE INVENTION

1. Field of the Invention:

This invention relates generally to integrated circuit structures, and specifically to (1) oxide isolated integrated injection logic circuits utilizing a PNP and an NPN transistor wherein a lessened resistance between the collector of the PNP transistor and the base of active NPN transistor is desired, to (2) oxide isolated integrated injection logic circuits utilizing a PNP and an NPN transistor wherein a PNP $V_{BE}$ larger than the NPN $V_{BE}$ is desired, and to (3) oxide isolated integrated circuits utilizing double diffused lateral transistor structures.

2. Description of the Prior Art:

Circuits and structures utilizing integrated injection logic, sometimes abbreviated I²L or referred to as merged transistor logic, are well known in the integrated circuit arts. Such logic circuits or structures reduce a logic gate to a pair of merged complementary transistors in which a lateral PNP transistor is typically used as a current source for the base of an inverted NPN transistor. The NPN transistor, with a buried N type region as an emitter, will frequently have multiple collectors which may be used to drive other logic elements in a given circuit. I²L circuits possess the inherent advantage of being compact because a logic gate is reduced to a single semiconductor device. Further, I²L circuits can operate at very low voltages and can be simply fabricated utilizing relatively few masking operations.

Integrated injection logic circuit structures and the techniques by which they may be fabricated have been the subject of many papers and patents. See, for example, H. H. Berger and S. K. Weidman, "Merged Transistor Logic (MTL) —A Low-Cost Bipolar Logic Concept", K. Hart and A. Slob, "Integrated Injection Logic: A New Approach to LSI", both in *Journal of Solid-State Circuits*, Vol. SC-7, 1972, at pp. 340–346 and pp. 346–351, respectively; H. H. Berger and S. K. Wiedman, "The Bipolar LSI Breakthrough, Part I, and Part II, *Electronics*, Sept. 4, 1975, pp. 89–95 and Oct. 2, 1975, pp. 99–103; and U.S. Patent application Ser. No. 578,060, entitled "Combined Method for Fabricating Oxide-Isolated Vertical Bipolar Transistors and Complimentary Oxide-Isolated Lateral Bipolar Transistors and the Resulting Structures", assigned to Fairchild Camera and Instrument Corporation. A multiple collector structure for bipolar transistors is desribed in U.S. Patent application Ser. No. 657,439 entitled "Graduated Multiple Collector Structure for Inverted Vertical Bipolar Transistors" of Crippen, Hingarh and Verhofstadt and assigned to Fairchild Camera and Instrument Corporation.

One method of forming oxide isolated semiconductor structures is described in U.S. Pat. No. 3,648,125, entitled "Method of Fabricating Integrated Circuits with Oxidized Isolation and the Resulting Structure", by D. L. Peltzer, and assigned to Fairchild.

An oxide isolated double diffused lateral transistor structure, and an oxide isolated integrated injection logic structure appear as FIGS. 2 and 5A respectively, in U.S. Pat. No. 3,873,989, entitled "Double-Diffused Lateral Transistor Structure" issued Mar. 25 1975, to R. D. Schinella and M. P. Anthony and assigned to Fairchild.

Prior art structures, for example, as depicted in FIGS. 2 and 5A of U.S. Pat. No. 3,873,989, required undesirably large amounts of wafer surface for their fabrication. In one embodiment, the typically silicon nitride layer 56 of U.S. Pat. No. 3,873,989 was five to six microns wide (as measured from edge 57 to edge 95 in FIG. 2). This width was required to insure that during manufacture the P+ collector contact would not diffuse through the epitaxial layer and relatively narrow PNP transistor base to contact the P+ emitter thereby shorting the transistor.

The relatively wide silicon nitride layer of prior art structures results in a relatively wide region of P− epitaxial silicon being disposed between the base and the collector contact of the PNP transistor. In I²L structures with double diffused PNP transistors all but the relatively narrow N type base region was P type epitaxial material, and because of its resistivity, the P type material caused an undesirably large voltage drop between the collector of the PNP transistor and the base of the NPN transistor. Because this voltage drop is caused by the impurity concentration of the epitaxial layer, the resistance across which the voltage drop occurs will be referred to herein as the epitaxial resistance, and the equivalent resistor in a schematic diagram as the epitaxial resistor.

Existing I²L circuits function adequately at lower operating currents, but at higher currents the resistance of the epitaxial resistor typically on the order of one to two thousand ohms, significantly reduces the flow of current from the emitter of the PNP transistor to the base of the NPN transistor thereby slowing the operating speed and decreasing the gain of the I²L circuit. In some prior art devices only about 50% of the current flowing through the PNP emitter reached the NPN base. Because the voltage drop becomes more severe at increasing operating currents and for multiple collector embodiments of the NPN transistor, large arrays of I²L circuit elements are difficult to fabricate, and even when successfully fabricated, operate at undesirably slow speeds.

SUMMARY OF THE INVENTION

This invention overcomes several disadvantages of prior ar I²L structures by providing an I²L structure with a substantially reduced resistance between the collector of the PNP transistor and the base of the NPN transistor, i.e., a smaller epitaxial resistance. By appropriately forming an additional region of N conductivity type material in the region in which in prior art structures the epitaxial resistor was formed, and by allowing said N type material to contact the N type material which was previously the base region of the PNP transistor and followed by additional P+ diffusion, the epitaxial resistance can be substantially reduced, for example, to 50–100 ohms.

The reduced epitaxial resistance and increased PNP base dopant concentration allow the base-emitter voltage ($V_{BE}$) of the I²L structure PNP transistor to be greater than the base-emitter voltage of the NPN transistor. $V_{BE}$ (PNP) $> V_{BE}$ (NPN) implies that substantially all of the current injected by the PNP emitter will flow to the NPN base, rather than be wasted as PNP base current.

Further, the utilization of this N type material allows an adjoining P type region, which in prior art structures served only as the collector, to function as both the collector and the collector contact of the PNP transistor, thereby reducing the size of the overall semiconductor structure. Such size reduction is also facilitated by the increase in PNP base concentration resulting from the additional N type dopant introduced into the structure. The increased PNP base concentration allows narrowing the width of the silicon nitride layer from about 5-6 microns to 3-4 microns without incurring the risk of short circuits by comingling of the P type impurity betweeen the emitter contact and the collector contact.

According to one method of this invention, the N-type dopant used to lessen the epitaxial resistance and allow the same P type region to be both PNP collector and collector contact will be applied to two separate regions of the surface of the semiconductor structure adjacent a selected region of masking material. The two regions of impurity are then allowed to diffuse through the structure to contact each other and form a single larger region.

BRIEF DESCRIPTION OF THE DRAWINGS

FIG. 1h depicts the structure of one embodiment of this invention.

DETAILED DESCRIPTION

Figure 1A:
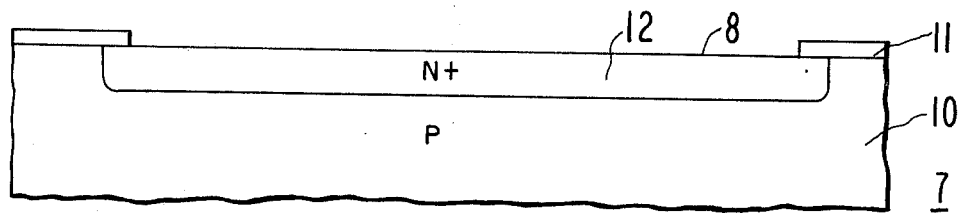
FIGS. 1a – 1h depict one method of fabricating an embodiment of this invention.

Referring now to the figures, and specifically to FIG. 1a, one method of fabricating an embodiment of this invention will be described. In FIG. 1a, a substrate 10, typically P conductivity type monocrystalline silicon, has a buried layer 12 of N conductivity type semiconductor material formed in selected portions of its upper surface 8. Buried layer 12 can be formed utilizing well-known diffusion, ion implantation, or other suitable techniques. As shown in FIG. 1a, buried layer 12 has been formed by a diffusion process through an opening in masking layer 11, typically an oxide of silicon. The techniques for forming layer 11 over those regions of surface 8 of substrate 10 where buried layer 12 is not desired are well known in the semiconductor arts and will not be described in detail herein. In one such process, however, a layer of silicon dioxide is formed across surface 8 and then removed from selected portions by a chemical process. After formation of buried layer 12 all of layer 11 may be removed from the surface 8 of semiconductor structure 7.

Figure 1B:
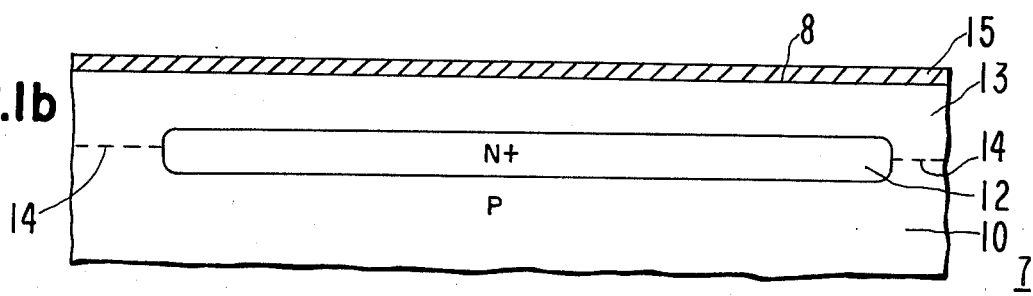
Figure 1C:
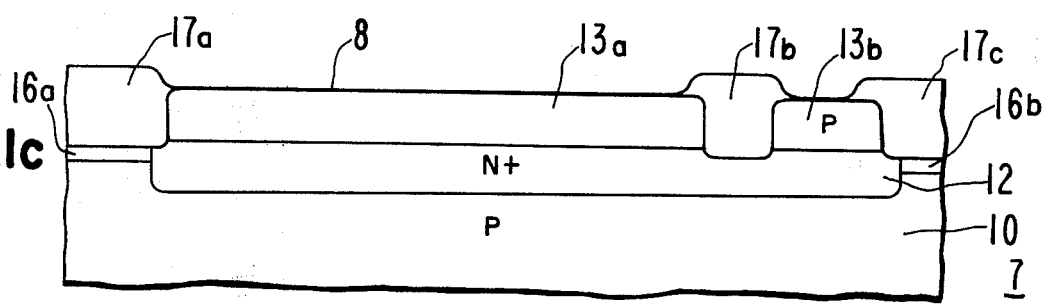
Figure 1D:
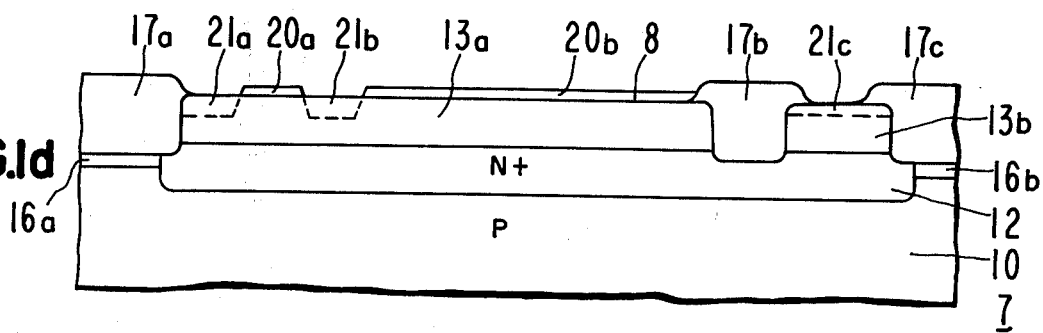
Figure 1E:
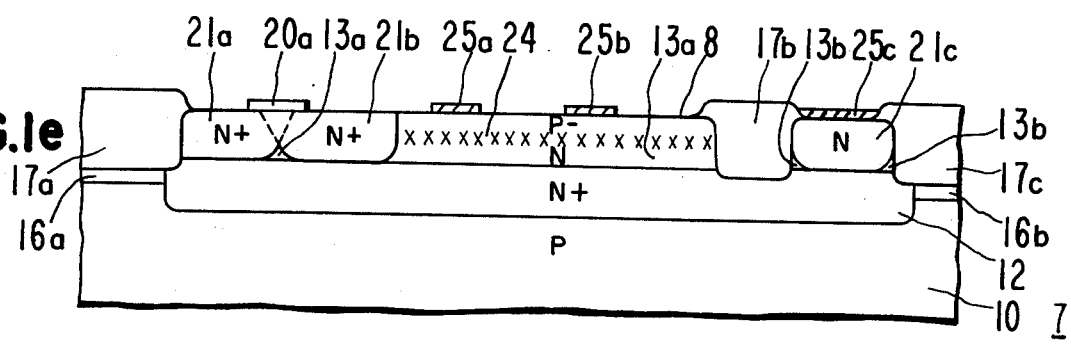

After removal of layer 11, a layer of epitaxial silicon 13 is formed on surface 8. See FIG. 1b. The metallurgical interface between epitaxial layer 13 and substrate 10 is shown by a dashed line 14 in FIG. 1b. Epitaxial layer 13 can be any suitable material such as P or N type semiconductor silicon, but in a preferred embodiment typically comprises intrinsic epitaxial silicon, as said material, because of its nearly neutral conductivity type, can be easily doped to selected conductivity during later process steps, for example, in forming regions 21a and 21b, as shown in FIGS. 1d and 1e. A layer of masking material 15 is then formed across surface 8 (FIG. 1b). Masking material 15 typically will be silicon nitride because oxides of silicon will not grow on silicon nitride, however, other materials may also be used in place of silicon nitride.

Openings (not shown) are next made in nitride layer 15 according to well-known semiconductor manufacturing procedures, following which an etching solution is applied to surface 8 of the semiconductor structure 7 for a suitable period. The silicon nitride layer 15 and portions of epitaxial layer 13 will be removed from those regions where subsequent formation of insulating material 17a, 17b, and 17c is desired. (See FIG. 1c). One method of forming oxide isolated integrated circuit structures is described in U.S. Pat. No. 3,648,125, cited above.

After removal of the desired amount of epitaxial material 13, a guard ring 16 may be formed by insertion of P conductivity type semiconductor material into selected openings in the epitaxial silicon 13. Typically, P type material 16a and 16b will be boron, however, other P type semiconductor materials may also be used. The resulting guard ring 16a and 16b is depicted in FIG. 1c. Insulating material 17a, 17b, and 17c, typically silicon dioxide, is then formed in the openings in silicon nitride layer 15, and allowed to extend downward to contact buried layer 12 to thereby create at least one pocket of electrically isolated epitaxial silicon 13 in which active and/or passive semiconductor devices may be formed. The isolated packet shown in FIG. 1c has two parts, one containing layer 13a and the other layer 13b. The two parts are connected by buried layer 12. Silicon nitride layer 15 is then removed from the semiconductor structure 7.

As shown in FIG. 1d, after formation of insulating material 17a, 17b, and 17c, masking material 20, typically an oxide of silicon, is deposited on surface 8 and removed from selected regions. The remaining regions of masking material 20a and 20b are shown in FIG. 1d. N conductivity type semiconductor material 21a, 21b, and 21c is then introduced into the semiconductor structure 7 through the openings in masking material 20. The N type material is usually inserted by a procedure known in the semiconductor arts as a predeposition, although ion implantation or other processes may be used. Typically, the N conductivity type material 21a, 21b, and 21c, will be phosphorus, but other N type semiconductor materials may be used. The appearance of the semiconductor structure following introduction of the N type material 21a, 21b, and 21c, by predeposition is shown on FIG. 1d.

The N type material 21a, 21b, and 21c, is then thermally diffused, usually by a thermal process, into the semiconductor structure 7, as shown in FIG. 1e. During this and other processes, the N type impurity of buried layer 12 will diffuse upward into the lower postions of epitaxial layer 13, particularly if layer 13 is intrinsic epitaxial silicon. See region 13a in FIG. 1e. Additional operations well known in the semiconductor arts may then be performed to provide an appropriately defined mask layer for forming the base of the NPN transistor. A P conductivity type semiconductor material is then introduced into surface 8 of the semiconductor structure 7 by diffusion or any suitable process. In the example shown, P type impurity 24 has been introduced into region 13a by ion implantation thereby obviating the need for altering layer 20. P type material 24 may be any suitable semiconductor material such as boron. Material 20b (FIG. 1d) is then removed from those regions of the semiconductor structure 7 in which boron 24 has been implanted. Although boron 24 also may be introduced into N conductivity type regions 21b and 21c, the amount of impurity 24 can be controlled by well known semiconductor fabrication technology to be insufficient to alter the conductivity type of N type region 21b. An additional layer 25 is then formed on surface 8 and selectively removed, to create regions 25a, 25b, and 25c. Typically layer 25 will be silicon nitride for the reasons previously set forth herein.

Figure 1F:
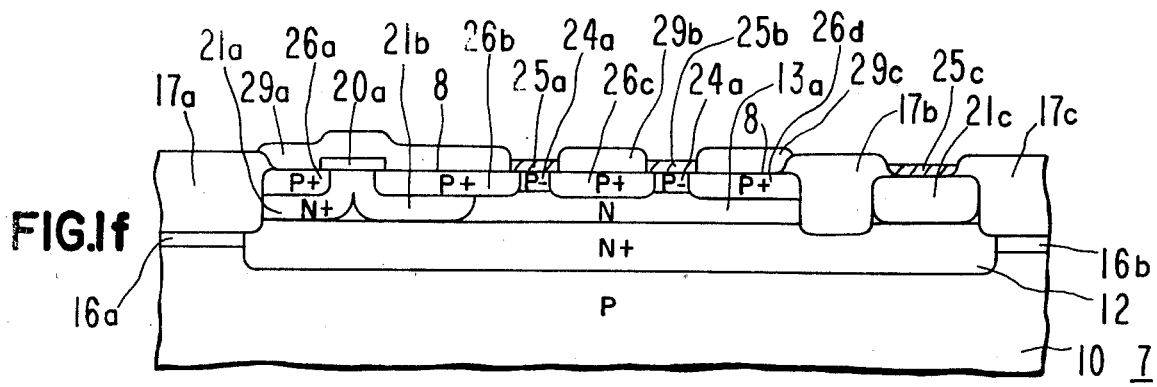

As shown in FIG. 1f, P conductivity type semiconductor material 26, for example, boron, is then introduced by any suitable well known process, into surface 8 to create P conductivity type regions 26a, 26b, 26c, and 26d. Region 26a will serve as the emitter of a PNP transistor, while region 26b will be the collector of that transistor. The surface is then oxidized to create silicon dioxide regions 29a, 29b, and 29c. No oxide will form on the surface of silicon nitride layer 25a, 25b, and 25c.

Figure 1G:
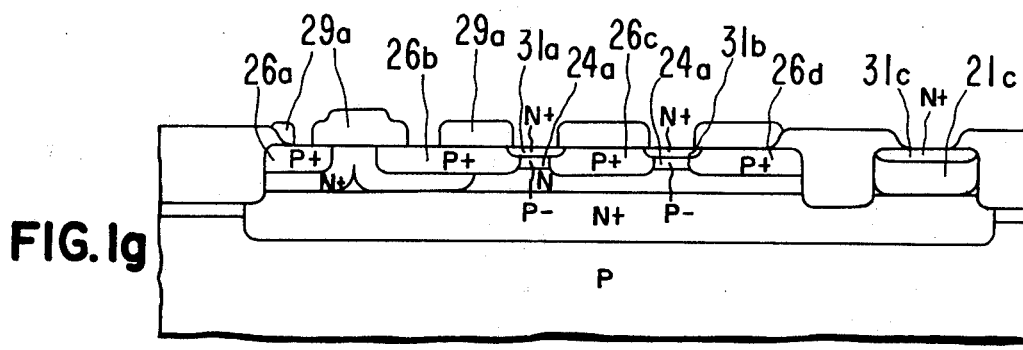

As shown in FIG. 1g, after formation of the oxide layer 29, the remaining silicon nitride 25a, 25b, and 25c is removed. Then by any suitable process N type regions 31a, 31b, and 31c are formed. In one technique this is accomplished by predeposition and diffusion. If additional ohmic connections to regions of the semiconductor structure beneath the oxide 29 are desired, additional openings for such connections may be made in oxide layer 29 in a well known manner. In the embodiment shown, ohmic connections are desired to P conductivity type regions 26a and 26b, and therefore two additional openings in oxide layer 29a are made above regions 26a and 26b. These openings are also shown in FIG. 1g.

Figure 1H:
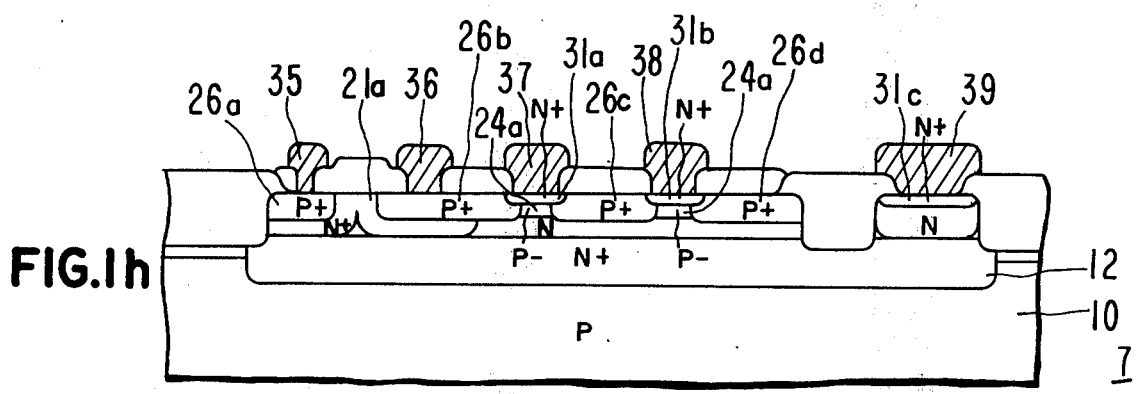

Metal connections 35, 36, 37, 39 and 39, may then be made in a well known manner to the desired regions of the integrated circuit structure as shown in FIG. 1H. Connections 35 and 36 are to the PNP transistor and collector respectively, while connections 37 and 38 are to the two collectors of the NPN transistor. Connection 39, via buried layer 12, is to both the NPN emitter and the PNP base.

Figure 2:
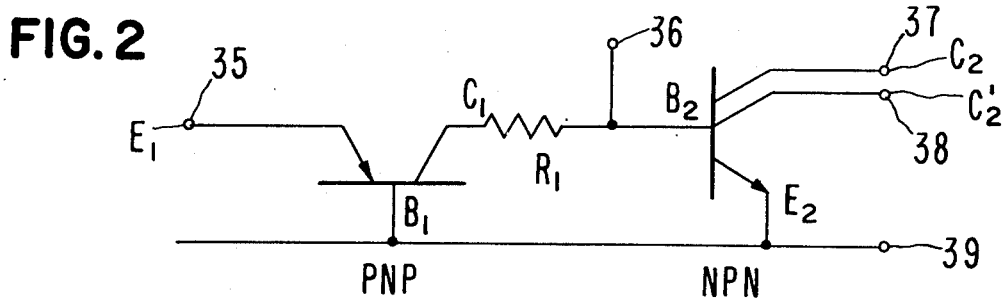
FIG. 2 is a schematic of the structure shown in FIG. 1h.

An electrical schematic of the integrated circuit structure shown in FIG. 1h appears as FIG. 2. In FIG. 2 the PNP transistor with emitter $E_1$, collector $C_1$, and base $B_1$, and the NPN transistor with emitter $E_2$, base $B_2$, and collectors $C_2$ and $C_2'$ are shown. The electrical connections, 35, 36, 37, 38 and 39 shown in FIG. 1h are shown in their equivalent location in FIG. 2. Additionally, resistor $R_1$ is shown in FIG. 2. $R_1$ corresponds to the resistance between PNP collector $C_1$ and NPN base $B_2$, or as depicted in FIG. 1h across the width of region 26b. As previously discussed herein, this invention substantially reduces the resistance of $R_1$.

Although the NPN transistor portion of the I²L structure shown schematically in FIG. 2 and in cross-section in FIG. 1h has only two collectors, $C_2$ and $C_2'$ or 31a and 31b, respectively, any desired number of collectors may be formed. It is an advantage of this invention that multiple collector embodiments of the NPN transistor will operate at higher speeds and with increased gain when compared with prior art structures.

It will be evident to those skilled in the semiconductor manufacturing arts that equivalent semiconductor materials may be utilized in place of those described in conjunction with the embodiments of this invention. In addition, semiconductor materials of opposite conductivity type to those described herein may also be utilized to form equivalent semiconductor structures.

What is claimed is:

1. An integrated injection logic circuit having improved current characteristics comprising:
   a semiconductor material having at least one substantially flat surface,
   a lateral transistor having an emitter of first conductivity type formed in a first portion of said semiconductor material adjacent said at least one surface, a base of opposite conductivity type to the emitter formed in a second portion of said semiconductor material adjacent said at least one surface, a collector of first conductivity type formed in a third portion of said semiconductor material adjacent said at least one surface, said second portion being laterally disposed between the first portion and the third portion, said second portion being formed by the diffusion of opposite conductivity type impurity into a first region of the surface and into a second region of the surface, the first and second regions being non-contiguous;
   a vertical transistor having a second collector of opposite conductivity type to the collector of the lateral transistor defined by a fourth portion of said semiconductor material adjacent said at least one surface, a second base of first conductivity type defined by a fifth portion of said semiconductor material underlying said fourth portion, and a second emitter of opposite conductivity type to the second base defined by a sixth portion of said semiconductor material underlying said fifth portion and spaced from said fourth portion by said fifth portion;
   said collector of said lateral transistor being formed subsequent to formation of said lateral transistor base and providing a low resistance current path to said base of said vertical transistor;
   means for electrically contacting said first emitter, first base and first collector; and
   means for electrically contacting said second emitter, said second base and said second collector.

2. Structure as in claim 1 wherein:
   the first, third, and fifth portions of semiconductor material are P conductivity type, and
   the second, fourth, and sixth portions of semiconductor material are N conductivity type.

3. Structure as in claim 1 wherein:
   the first, third, and fifth portions of semiconductor material are N conductivity type, and
   the second, fourth, and sixth portions of semiconductor material are P conductivity type.

4. Structure as in claim 1 wherein the second portion is electrically connected to the fourth portion.

5. Structure as in claim 1 wherein the means for contacting the second emitter comprises a second conducting channel which contacts the second emitter within the semiconductor material and provides electrical communication with the surface at a region separated from each of the first emitter, base, collector second emitter, second base, and second collector.

6. Structure as in claim 5 wherein the second conducting channel comprises:
   a second buried layer of semiconductor material connecting the second emitter to the base, and
   a second sink of semiconductor material connecting said second buried layer to the at least one surface.

7. Structure as in claim 6 wherein a second closed path of semiconductor material surrounding the structure is oxidized to extend between the second buried layer and the at least one surface.

8. Structure as in claim 7 wherein:
the second buried layer, the second sink, the base, and each of the at least one second collectors are N type semiconductor material, and
the emitter, the collector, and each of the at least one second bases are P type semiconductor material.

9. Structure as in claim 8 wherein:
the second buried layer, the second sink, the base, and each of the at least one second collectors are P type semiconductor material, and
the emitter, the collector, and each of the at least one second bases are N type semiconductor material.

10. A method of forming a lateral transistor semiconductor structure comprising:
forming an isolated pocket of semiconductor material in a substrate having a substantially flat upper surface, the upper surface of said isolated pocket being divided into a first and a second region,
forming a region of masking material over selected portions of said first region,
introducing first impurity of one conductivity type into the pocket from two non-contiguous regions of the flat surface adjacent the region of masking material, and allowing the first impurity introduced into the other of said regions to contact the first impurity introduced into the other of said regions,
introducing second impurity of opposite conductivity to the first impurity into the two non-contiguous regions and into the second region of the upper surface, the second impurity introduced into either of the two non-contiguous regions not being in contact with the second impurity introduced into the other of the two non-contiguous regions,
introducing first impurity into selected portions of the second region; and
wherein the step of introducing second impurity includes introducing second impurity into all of the second region, subsequently introducing second impurity into each of the two non-contiguous regions in the first region, and into all of the second region, except for said selected portions.

11. A method as in claim 10 wherein the first impurity is N conductivity type and the second impurity is P conductivity type.

12. A method as in claim 10 wherein the first impurity is N conductivity type and the second impurity is P conductivity type.

* * * * *